(12) United States Patent
Ananth et al.

(10) Patent No.: US 12,431,874 B2
(45) Date of Patent: Sep. 30, 2025

(54) INTEGRATED GaN-BASED LOGIC LEVEL TRANSLATOR

(71) Applicant: Efficient Power Conversion Corporation, El Segundo, CA (US)

(72) Inventors: Ravi Ananth, Laguna Niguel, CA (US); Edward Lee, Fullerton, CA (US); Michael Chapman, Long Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 133 days.

(21) Appl. No.: 18/341,206

(22) Filed: Jun. 26, 2023

(65) Prior Publication Data

US 2023/0421139 A1 Dec. 28, 2023

Related U.S. Application Data

(60) Provisional application No. 63/356,434, filed on Jun. 28, 2022.

(51) Int. Cl.
*H03K 5/22* (2006.01)
*H03K 3/0233* (2006.01)
(Continued)

(52) U.S. Cl.
CPC ..... *H03K 3/02337* (2013.01); *H03K 3/35613* (2013.01); *H03K 5/2481* (2013.01); *H03K 19/018528* (2013.01)

(58) Field of Classification Search
CPC .......... H03K 5/22; H03K 5/24; H03K 5/2472; H03K 5/2481; H03K 5/003; H03K 3/00;
(Continued)

(56) References Cited

U.S. PATENT DOCUMENTS 9,755,628 B2 9/2017 Hu
10,348,293 B2 7/2019 Abesingha et al.
(Continued)

FOREIGN PATENT DOCUMENTS

EP 3 748 856 A2 12/2020
TW 201725858 A 7/2017

OTHER PUBLICATIONS

Maxim Integrated Application Note 4414, "Level Shifting Digital Signals", Aug. 18, 2009.

*Primary Examiner* — Hai L Nguyen
(74) *Attorney, Agent, or Firm* — Blank Rome LLP

(57) ABSTRACT

A single-ended or differential level-shifting interface for GaN ICs that allows GaN ICs to be controlled with standard low-voltage CMOS level inputs. The logic level shift circuit is based on a resistive network is therefore insensitive to process and temperature variations, making it particularly well suited for implementation in a GaN IC. The resistive network for a single-ended input signal includes a first branch with a voltage divider connected to the input signal. The voltage divider of the first branch provides a level shifted and scaled input signal to the first input of a comparator at the optimal bias point of the comparator. The resistive network also includes a second voltage divider branch with hysteresis for providing a trip voltage to the second input to the comparator, also at the optimal bias point of the comparator. The comparator outputs complementary bipolar level shifted signals corresponding to the input signal.

4 Claims, 7 Drawing Sheets

(51) Int. Cl.
*H03K 3/356* (2006.01)
*H03K 5/24* (2006.01)
*H03K 19/0185* (2006.01)

(58) Field of Classification Search
CPC ............ H03K 3/0233; H03K 3/02337; H03K 3/35613; H03K 3/33563; H03K 19/0175; H03K 19/0185; H03K 19/018528
USPC .......................................................... 327/333
See application file for complete search history.

(56) References Cited

U.S. PATENT DOCUMENTS

| | | |
|---|---|---|
| 10,727,834 B2 * | 7/2020 | Lee ................ H03K 19/018507 |
| 11,329,636 B2 | 5/2022 | Cascio et al. |
| 2017/0288672 A1 | 10/2017 | Schemm |

* cited by examiner

INTEGRATED GaN-BASED LOGIC LEVEL TRANSLATOR

CROSS-REFERENCE TO RELATED APPLICATION

This application claims the benefit of U.S. Provisional Application No. 63/356,434 filed Jun. 28, 2022, the disclosure of which is incorporated by reference in its entirety.

BACKGROUND OF THE INVENTION

In general, modern microprocessors implemented in power control systems use logic levels that are derived from 1.8V or 3.3V power supplies. Accordingly, the input control logic levels to a power integrated circuit (IC) can be as low as 1.4V for 1.8V microprocessor supply or 2.0V for a 3.3V microprocessor supply. Silicon-based CMOS field effect transistors (FETs) typically have a threshold voltage Vth within a range of 0.6-0.7V. Accordingly, an input high voltage of 1.4V from a CMOS controller is sufficient to turn-on CMOS FETs.

However, GaN FETs have a threshold voltage Vth within a range of 1.5-2.5V, and typically require a control voltage of at least 4V to fully turn-on. Thus, using 2.4V control signal from a CMOS controller may not reliably guarantee turn-on of the GaN FET. Accordingly, for a GaN FET to be controllable using CMOS logic levels, a dedicated circuit is required that can translate CMOS logic level signals into signals having a voltage level sufficient to turn-on a GaN FET.

FIG. 1 is a typical logic-level shifter circuit 100. Circuit 100 includes a supply voltage $V_{dd1}$ connected to FET transistor 102 through a resistor 101. The source of FET 102 is connected to the gate of FET 104 in an inverter stage X connected to a higher supply voltage $V_{ddX}$. Resistors 101 and 103 are selected based upon the drive strength (final output level) required for a particular application. The resulting output from the inverter stage X toggles between 0V and the voltage $V_{ddX}$.

In circuit 100, FETs 102 and 104 must have a threshold voltage Vth significantly lower than the supply voltage $V_{dd}$ for proper operation of the circuit. If $V_{dd}$ is less than or equal to the threshold voltage Vth of FET 102, or the threshold voltage Vth of the FET 102 increases over time to be greater than $V_{dd}$, then the level shifter circuit 100 will not function correctly.

FIG. 2 is a conventional differential latch-based logic-level shifter circuit 200. Differential latch-based logic-level shifter circuit 200 includes inputs Xn and X of opposite polarity that are supplied to a differential cross-coupled structure which latches the output to a higher supply voltage $V_{ddH}$ than the input. Inputs Xn and X are at a lower voltage $V_{ddL}$, that is lower than the supply voltage $V_{ddH}$. As in the circuit of FIG. 1, the circuit of FIG. 2 only works if the threshold voltage Vth of the NFETs 201-204 is significantly lower than the input voltage level $V_{ddL}$. If the input voltage level is less than or equal to the threshold voltage Vth of FETs 201-204, then the differential latch-based logic-level shifter circuit 200 will not function correctly.

FIG. 3 is a typical common-gate based logic-level shift circuit 300. Common-gate based logic-level shift circuit 300 includes a FET 102 having a source S, a drain D, and a gate G. The input (low side) is fed to the source S of FET 102, the gate G of which is DC biased. The high-side output at the drain D of FET 102 swings in-phase with the low-side input. Accordingly, when the input to the source S swings high to the gate-voltage level, FET 102 turns off and the high-side swings to the higher pull-up voltage of $V_{dd}$. The input threshold level is set with a gate-voltage bias (sourced from the voltage divider formed of resistors 104 and 106) to turn-off FET 102 when the input level reaches the threshold voltage $V_{th}$ of FET 102.

In the circuit of FIG. 3, input signal levels lower than the threshold voltage $V_{th}$ of FET 102 can be used to obtain a level-shifted output that swings between $V_{dd}$ and ground. However, trip levels of common-gate based logic-level shift circuit 300 are dependent upon the threshold voltage $V_{th}$ of FET 102, the value of which is highly process dependent and temperature dependent. Additionally, the hysteresis level, which is achieved by changing gate-voltage levels, is also affected by variations in the threshold voltage $V_{th}$ of FET 102. Accordingly, the trip voltage and hysteresis level of common-gate based logic-level shift circuit 300 vary with changes in the threshold voltage $V_{th}$ of FET 102.

FIG. 4 shows a prior art voltage divider level-shifting circuit 400. Voltage divider level shifting circuit 400 includes a differential comparator 402 powered by a 5V supply, and a resistive network at the input that transforms a negative pulse train into level shifted complementary bipolar outputs. The voltage divider formed by resistors 406 and 408 level scales the input signal, which is then applied to the non-inverting of differential comparator 402. A second voltage divider formed by resistors 404 and 410 is connected to the non-inverting input of differential comparator 402. This circuit advantageously level-shifts an input signal having a voltage lower than the threshold voltage $V_{th}$ of a GaN FET into an output signal that swings between $V_{cc}$ and ground.

In the circuit of FIG. 4, however, a floating input to differential comparator 402 will set the output of the voltage divided logic-level shifter circuit 400 positive (or negative, based upon the input configuration). Additionally, since the input to differential comparator 402 is not biased at the optimal gain of differential comparator 402, the output swing relies solely upon a large swing of the input signal. If the circuit of FIG. 4 is implemented in GaN for use in a GaN IC, the low gain of a GaN comparator will cause a relatively slow response to input signal swings that are not around the optimal bias point of the comparator.

It would therefore be desirable to provide a level-shifter circuit, implemented in GaN, that translates low-voltage CMOS signals to a level sufficient to turn-on a GaN FET, and avoids the disadvantages of the circuits noted above.

SUMMARY OF THE INVENTION

The present invention overcomes the disadvantages and achieves the objectives described above by providing a GaN based level-shifter circuit that translates low-voltage CMOS signals to a level sufficient to turn-on a GaN FET.

More specifically, the present invention, as described herein, is an integrated GaN based logic-level shifter that includes a GaN differential comparator and a resistive network. The resistive network includes a first voltage divider for receiving a single-ended input signal and outputting a level shifted and scaled signal, and second voltage divider for generating a trip voltage. The second voltage divider circuit includes a resistive hysteresis circuit. The level shifted and scaled signal is connected to the first input of the GaN differential comparator, and the trip voltage from the second voltage divider is connected to the second input of the GaN differential comparator, such that positive and negative outputs of the GaN differential comparator comprise positive and negative complementary bipolar level shifted signal corresponding to the input signal.

The present invention also provides an integrated GaN based logic-level shifter for a differential input signal. For a differential input, the resistive network includes two voltage divider branches, one for each input. Each branch of the resistive network receives an input signal and outputs a level shifted and scaled signal to a corresponding input of the comparator. A resistive hysteresis circuit may also be included in the negative resistor branches of this embodiment of the invention.

The resistive network-based level shifter of the present invention is process and temperature insensitive, and is particularly well suited for level shifting CMOS level inputs and LVDS type differential signals to higher levels for controlling GaN FETs, which have gate threshold levels that are process and temperature dependent. The resistive network of the present invention advantageously provides level shifted inputs at the optimal bias point of a GaN comparator. The trip level range of the logic-level shifter of the present invention is much tighter than that of common gate level shifters, as the trip threshold range is limited only by the input offset levels of the comparator.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which.

DETAILED DESCRIPTION OF THE PREFERRED EMBODIMENTS

It is to be understood that the figures and descriptions of the present invention may have been simplified to illustrate only elements that are relevant for a clear understanding of the present embodiments. Those of ordinary skill in the art will recognize that other elements may be desirable and/or required in order to implement the present embodiments. It is also to be understood that the drawings included herewith only provide diagrammatic representations of the presently preferred embodiments of the present invention. Reference will now be made to the drawings wherein like structures are provided with like reference designations.

Figure 1:
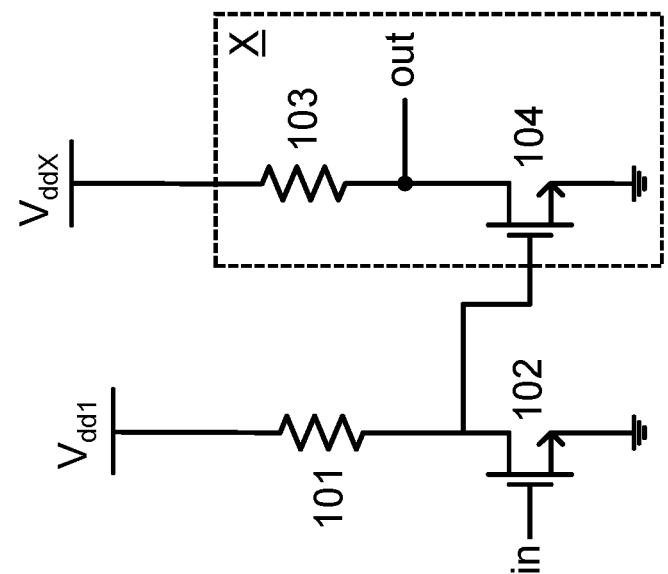
FIG. 1 is a conventional logic-level shifter circuit.
Figure 2:
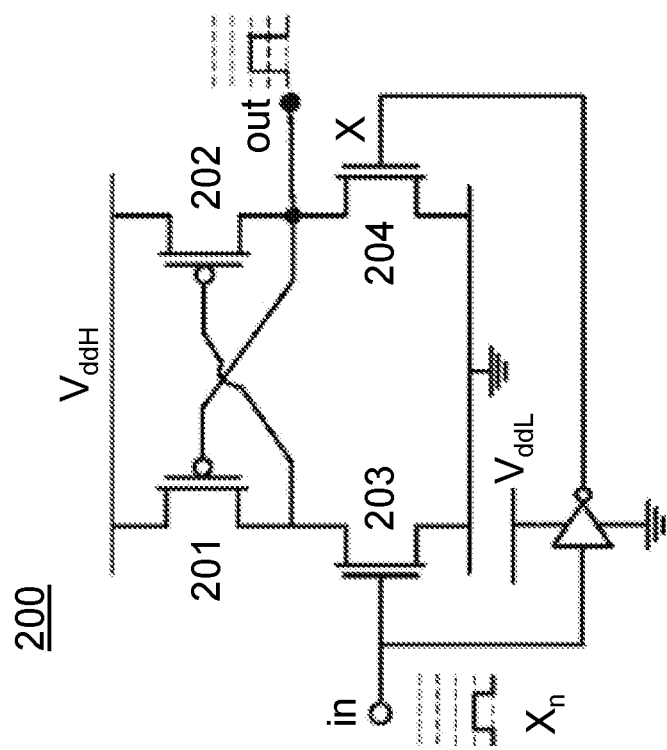
FIG. 2 is a conventional differential latch-based logic-level shifter.
Figure 3:
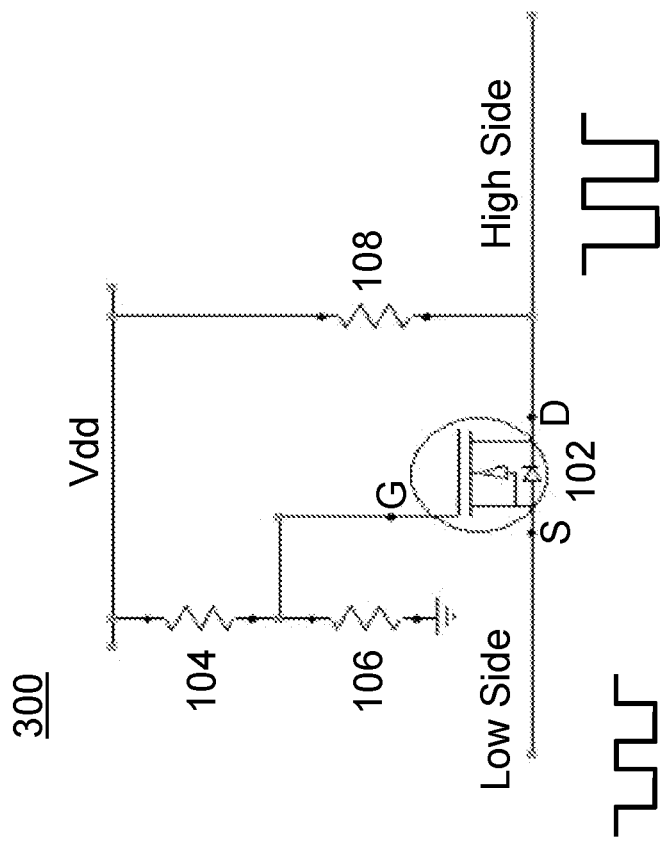
FIG. 3 is a conventional common-gate based logic-level shifter.
Figure 4:
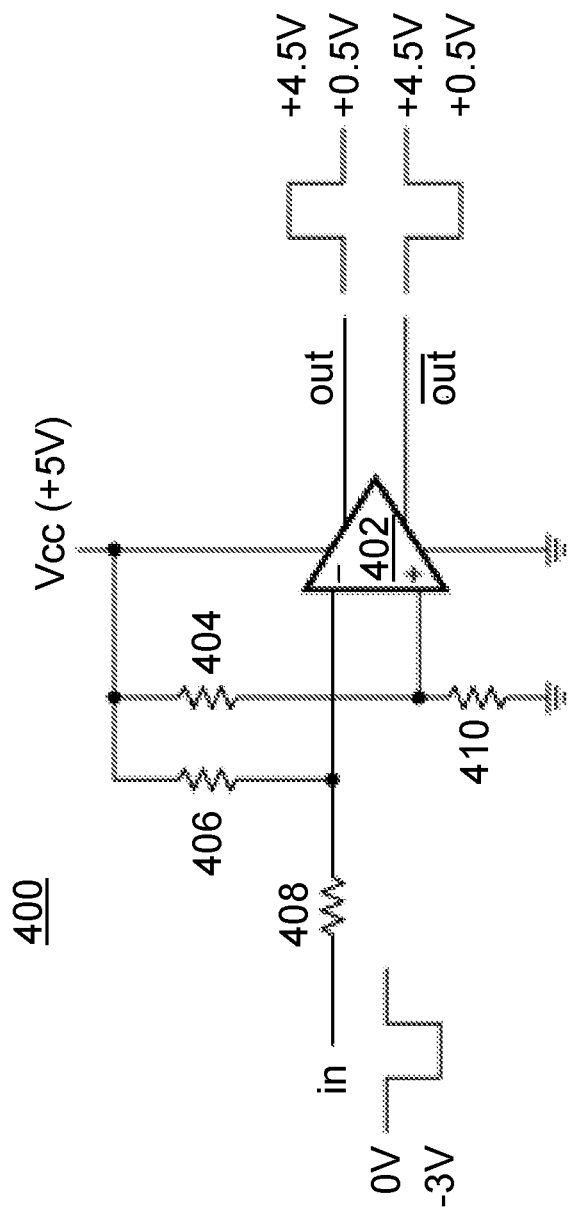
FIG. 4 is a prior art voltage divider level-shifter circuit design.
Figure 5:
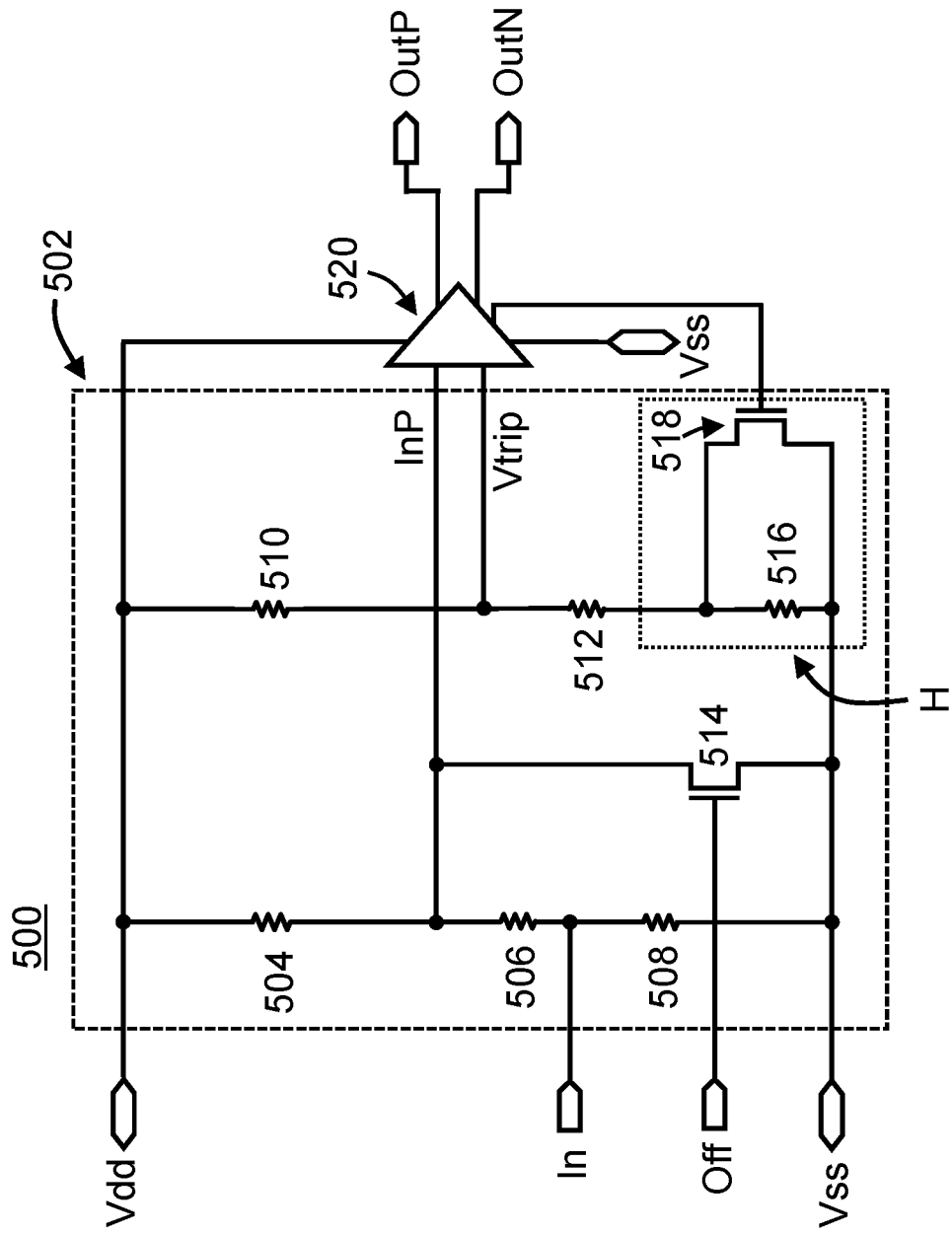
FIG. 5 shows the resistive network-based logic-level shifter circuit of the present invention with a single-ended input.

FIG. 5 shows the resistive-network based logic-level shifter of the present invention, designed to level shift a low voltage input signal (e.g., a CMOS level signal) to a voltage level above the maximum threshold voltage $V_{th}$ of a GaN transistors integrated in a GaN IC. Level shifter circuit 500 includes a resistive network 502, a GaN differential comparator 520, a single-ended input signal In, and an input Off (to pull the input signal low), as well as power supply sources Vdd and Vss. GaN differential comparator 520, connected to power supply sources Vdd and Vss, receives input signals InP and Vtrip from resistive network 502 and produces level shifted output signals OutP and OutN of opposite phase (complementary bipolar). Vtrip is the level that the input signal "In" must exceed as a minimum $V_{inHi\_Low}$ level for output OutP to go high.

More specifically, as shown in FIG. 5, input signal In is connected to a voltage divider between Vdd and Vss which includes a resistor 504, a scale resistor 506, and an offset resistor 508, connected in series and forming a voltage divider for level shifting and scaling the input In to input InP. The values of resistor 504 and scale resistor 506 are set such that InP hovers around the optimal bias point of GaN comparator 520, thereby improving the speed of the comparator. Offset resistor 508 ensures that if the input "In" is floating, the output OutP stays low and output OutN stays high. The value of offset resistor 508 is dependent upon the amount of maximum input offset expected at comparator 520.

The voltage of the Vtrip input to GaN comparator 520 is determined by the values of resistors 510 and 512, which form a voltage divider to set the voltage at the Vtrip input to the comparator 520. In a similar manner to the voltage divider for the input signal, resistors 510 and 512 are set so that Vtrip hovers around the optimal bias point for the input of comparator 520. Vtrip is also determined by hysteresis circuit H formed of by resistor 516 and FET 518, which is controlled by one of the positive outputs of the comparator 520, similar to the output OutP. Hysteresis circuit H ensures that any noise voltage within a range around the trip point of the comparator 520 does not reset the output of the comparator 520. This is accomplished by increasing (or decreasing) the reference voltage by a scaled amount that exceeds the noise level expected once the comparator 520 has made a first trip. Since the hysteresis is set by a resistor divider, it is insensitive to process or temperature variations, similar to the rest of the resistive network 502.

Level shifter circuit 500 produces both a positive level shifted output signal OutP and a negative level shifted output signal OutN based upon the single ended input signal. Level shifter circuit 500 can be turned off by applying a logic high signal to "Off" terminal, which turns on FET 514, shorting input InP to Vss (ground), bringing OutP low and OutN high.

Figure 6:
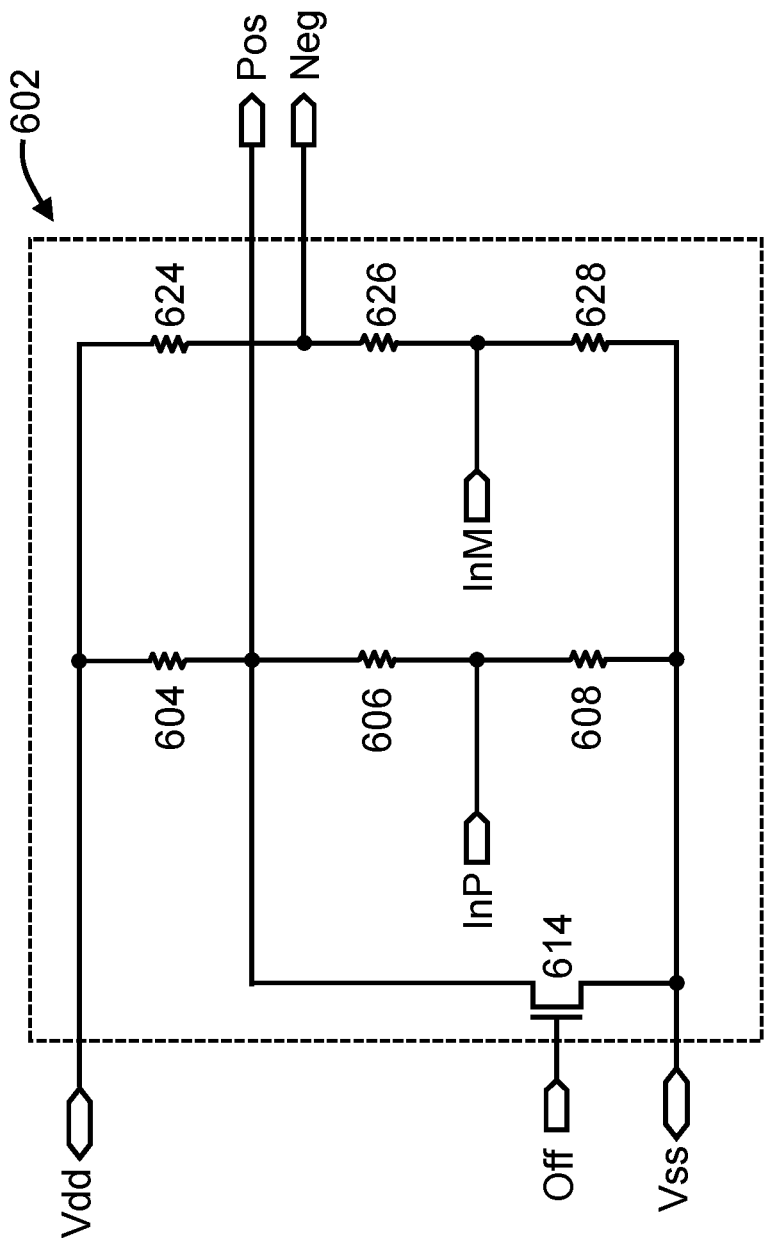
FIG. 6 shows the resistive network-based logic-level shifter circuit of the present invention with a differential input.

FIG. 6 shows a resistive network 602 designed for a differential signal input, rather than the single-ended input of FIG. 5. In the differential input embodiment of FIG. 6, both input branches of resistive network 602 follow the topology of the "In" branch of FIG. 5. Thus, in FIG. 6, differential signal inputs InP and InM are each connected to a corresponding resistive voltage divider between Vdd and Vss. The voltage divider for positive input InP includes a resistor 604, a scale resistor 606, and an offset resistor 608 connected in series. Similarly, the voltage divider for input InM includes a resistor 624, a scale resistor 626, and an offset resistor 628 connected in series. Although not shown, the signals from the voltage divider, Pos and Neg, are connected, respectively, as inputs to the non-inverting and inverting terminals of a GaN differential comparator, similar to the connection of InP and Vtrip to GaN comparator 520 shown in FIG. 5. Also, similar to FET 514 of FIG. 5, FET 614 is provided to short Pos to Vss (ground), bringing OutP low and OutN high, if the input signal Off is set to a logic high. Although not shown, a hysteresis circuit, such as that depicted in FIG. 5 and described above, may be connected to the negative resistor branches to produce hysteresis for the corresponding logic translators.

The value of offset resistor 628 for the InM input is made slightly higher than the value of offset resistor 608 for the InP input to ensure that, if the input signals InP and InM are floating, the output stays low. The difference in the value of offset resistors 608 and 628 depends on the amount of maximum input offset expected at the GaN comparator to which voltage divider outputs Pos and Neg are connected. The values of the offset resistors 608 and 628 can also be set to allow for level-shifting of low-voltage differential signals (LVDS). A typical LVDS common-mode voltage is approximately 1.3V, which is well below threshold voltage $V_{th}$ values of GaN FETs.

Figure 7:
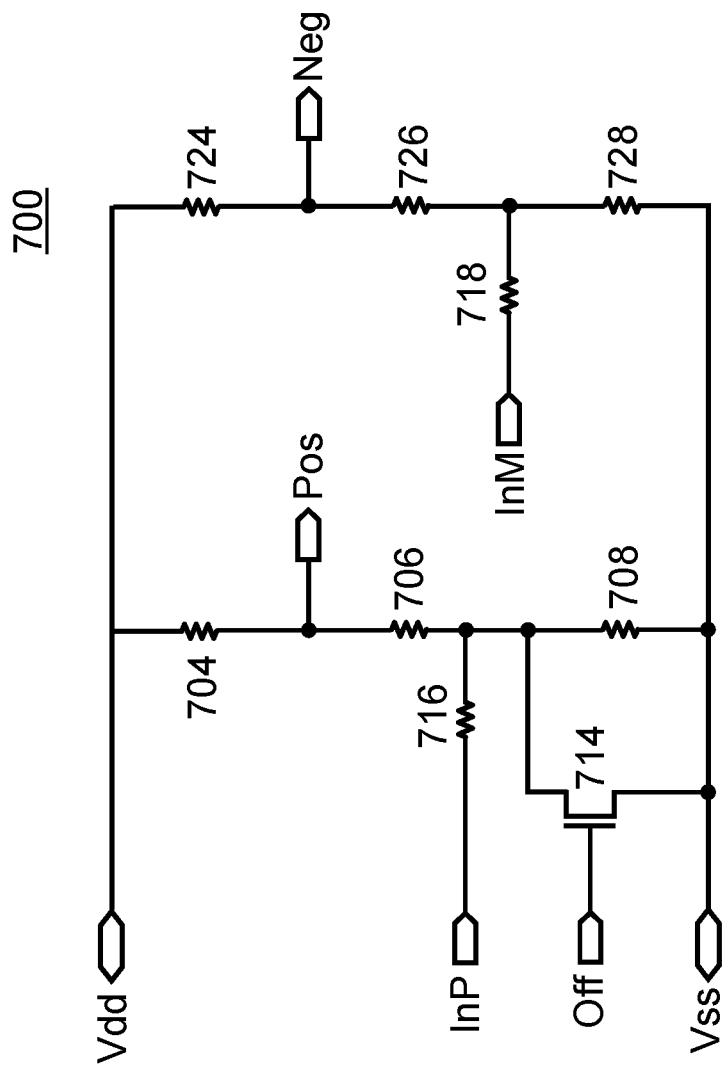
FIG. 7 shows the resistive network-based logic level shifter circuit of the present invention with a differential input and with series input resistors to accommodate large input signals.

FIG. 7 shows a resistive network-based logic-level shifter circuit of the present invention with a differential input similar to that of FIG. 6, but with series input resistors to accommodate large input signals. Specifically, logic-level shifter circuit 700 includes series resistors 716 and 718 at inputs InP and InM, respectively, to reduce large input signal voltages to lower levels. In FIG. 7, a hysteresis circuit, such as that depicted in FIG. 5, may be connected to the negative resistor branches to produce hysteresis for the corresponding logic translators. The logic-level shifter of FIG. 7, with resistive network 700, thus achieves both the input attenuation and level-shifting needed to interface with a GaN FET, while ensuring that the maximum input voltage swing does not damage the input GaN FET.

In summary, the present invention, in the various embodiments described above, advantageously provides a circuit topology that can be used as a single-ended or differential level shifting interface for GaN ICs that allows the ICs to be controlled with standard low-voltage CMOS-level inputs. The level shift circuitry of the present invention is based on a resistive network, and is therefore insensitive to process and temperature variations, making it particularly well suited for implementation in a GaN IC. The resistive network of the level shifter of the present invention includes offset resistive circuitry, such that the inputs to a GaN comparator can be set to hover around the optimal bias point of the comparator. The circuitry of the present invention includes hysteresis, which is also set by a resistive circuit and is thus also independent of process and temperature variations. Input resistors can be provided to scale down high voltage input signals prevalent in older analog control systems to avoid damage to the input GaN FETs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated GaN based logic-level shifter, comprising:
    a GaN differential comparator having first and second inputs and corresponding positive and negative outputs; and
    a resistive network comprising a plurality of resistors, the resistive network including:
        a first voltage divider for receiving an input signal and outputting a level shifted and scaled input signal, the first voltage divider comprising a first resistor, a scale resistor, and an offset resistor disposed in series between a voltage supply and a lower voltage; and
        a second voltage divider for generating a trip voltage, the second voltage divider including a resistive hysteresis circuit;
    wherein the level shifted and scaled input signal from the first voltage divider is connected to the first input of the GaN differential comparator, and the trip voltage from the second voltage divider is connected to the second input of the GaN differential comparator, such that the positive and negative outputs of the GaN differential comparator comprise complementary bipolar level shifted signals corresponding to the input signal; and
    wherein the values of the first resistor and the offset resistor are set such that the level shifted and scaled input signal to the first input of the comparator hovers around an optimal bias point of the comparator.

2. The integrated GaN based logic-level shifter according to claim 1, wherein the input signal is connected between the scale resistor and the offset resistor, and the first input of the GaN differential comparator is connected between the first resistor and the scale resistor.

3. The integrated GaN based logic-level shifted according to claim 1, wherein the second voltage divider generates a trip voltage which hovers around the optimal bias point of the comparator.

4. The integrated GaN based logic-level shifter according to claim 1, wherein the GaN differential comparator is configured to control the hysteresis circuit by outputting a signal to a gate of a FET connected across the hysteresis circuit.

* * * * *